United States Patent
Biber et al.

(10) Patent No.: US 9,513,351 B2
(45) Date of Patent: Dec. 6, 2016

(54) MAGNETIC RESONANCE COIL WITH OVERLAPPING COIL ELEMENTS

(75) Inventors: Stephan Biber, Erlangen/Frauenaurach (DE); Daniel Driemel, Oederan (DE); Helmut Greim, Adelsdorf (DE); Steffen Wolf, Röttenbach (DE)

(73) Assignee: Siemens Aktiengesellschaft, München (DE)

( * ) Notice: Subject to any disclaimer, the term of this patent is extended or adjusted under 35 U.S.C. 154(b) by 1095 days.

(21) Appl. No.: 13/618,635

(22) Filed: Sep. 14, 2012

(65) Prior Publication Data
US 2013/0241557 A1    Sep. 19, 2013

(30) Foreign Application Priority Data
Sep. 15, 2011 (DE) .......................... 10 2011 082 778

(51) Int. Cl.
G01R 33/36 (2006.01)
G01R 33/3415 (2006.01)
G01R 33/34 (2006.01)

(52) U.S. Cl.
CPC ....... G01R 33/3642 (2013.01); G01R 33/3415 (2013.01); *G01R 33/34007* (2013.01)

(58) Field of Classification Search
CPC ................. G01R 33/34007; G01R 33/3415; G01R 33/3642
USPC ............................ 324/300–322; 600/407–422
See application file for complete search history.

(56) References Cited

U.S. PATENT DOCUMENTS

| 4,859,947 A | 8/1989 | Boskamp |
| 5,293,519 A | 3/1994 | Yoshino et al. |
| 5,490,508 A * | 2/1996 | Kato ................... A61B 5/0555 324/318 |

(Continued)

FOREIGN PATENT DOCUMENTS

| CN | 87108042 A | 6/1988 |
| CN | 101169472 A | 4/2008 |

(Continued)

OTHER PUBLICATIONS

Epoxyset, "EpoxySet: Dielectric Epoxy Adhesives," Published Feb. 19, 2015; Date visited: Mar. 7, 2016; <http://www.epoxysetinc.com/dielectric-epoxy/>.*

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A magnetic resonance coil for transmitting and/or receiving magnetic resonance signals is provided. The magnetic resonance coil includes at least two overlapping coil elements. Coil conductors of the at least two overlapping coil elements intersect in intersection regions and are arranged on a support. Mutually overlapping coil elements of the at least two overlapping coil elements are arranged on different sides of the support. The support is formed from at least three layers of a support material. A cavity that is filled with air or a filler material, the dielectric constant of the filler material being lower than the dielectric constant of the support material, is provided in the intersection regions in a middle layer of the at least three layers.

12 Claims, 2 Drawing Sheets

(56) References Cited

U.S. PATENT DOCUMENTS

| | | | |
|---|---|---|---|
| 6,411,091 | B1 | 6/2002 | Sugiura et al. |
| 7,501,827 | B2 | 3/2009 | Ishii et al. |
| 2008/0143333 | A1 | 6/2008 | Greim et al. |
| 2009/0027053 | A1* | 1/2009 | Decke ............... A61B 5/0555 324/318 |
| 2009/0174408 | A1 | 7/2009 | Wang et al. |
| 2009/0178276 | A1 | 7/2009 | Lai et al. |
| 2010/0271022 | A1 | 10/2010 | Mitsui et al. |
| 2011/0031970 | A1 | 2/2011 | Ninomiya et al. |

FOREIGN PATENT DOCUMENTS

| | | |
|---|---|---|
| CN | 101482600 A | 7/2009 |
| CN | 101489356 A | 7/2009 |
| CN | 101573074 A | 11/2009 |
| CN | 101869478 A | 10/2010 |
| DE | 41 08 997 A1 | 9/1991 |
| DE | 10 2006 059 137 B3 | 7/2008 |
| JP | H0467845 A | 3/1992 |
| JP | 2002177237 A | 6/2002 |
| JP | 2010005192 A | 1/2010 |
| JP | 2010119744 A | 6/2010 |
| WO | WO2010018479 A1 | 2/2010 |

OTHER PUBLICATIONS

German Office Action dated May 3, 2012 for corresponding German Patent Application No. DE 10 2011 082 778.1 with English translation.

G. C. Wiggins et al., "A 96-channel MRI System with 23- and 90-channel Phase Array Head Coils at 1.5 Tesla," Proc. Intl. Soc. Mag. Reson. Med 13, 2005.

A. Kumar et al., "Noise Figure Limits for Circular Loop MR Coils," Proc. Intl. Soc. Mag. Reson. Med 17, 2009.

Japanese Report of Examination for corresponding Japanese Application No. 2012-202674, mailed Mar. 11, 2015, with English Translation.

Chinese Office action for Related Chinese Application No. 201210345031.1 dated Dec. 3, 2015 with English Translation.

Huangli "High Polymers" Edition 2, Chemical Industry Press, 1991.

Korean Office action for Related Korean Application No. 10-2012-0102063 dated Jun. 10, 2015.

Ping, Luo et al. "Introduction of IC Design" Tsinghua University Press, 2010.

Yudongming "Manual for synthetic resin and plastic properties" China Machine Press, Edition 1, 2011.

Japanese Office action for Related Japanese Application No. 10-2012-0102063 dated Feb. 5, 2016, with English translation.

* cited by examiner

MAGNETIC RESONANCE COIL WITH OVERLAPPING COIL ELEMENTS

This application claims the benefit of DE 10 2011 082 778.1, filed on Sep. 15, 2011.

BACKGROUND

The present embodiments relate to a magnetic resonance coil for transmitting and/or receiving magnetic resonance signals.

Magnetic resonance coils are used in magnetic resonance devices as transmission coils for transmitting magnetic resonance signals that deflect the nuclear spins and/or as a receiving coil for receiving magnetic resonance signals, from which the magnetic resonance images may be determined.

The use of local coils (e.g., antenna systems that are arranged immediately on (anterior) or beneath (posterior) an object to be examined such as a patient) is known. Local coils may be used to record magnetic resonance images with a high signal-to-noise ratio (SNR). The voltages that are induced by excited cores in the individual coil elements of the local coil during magnetic resonance measurement may be amplified with a low-noise pre-amplifier (e.g., low noise amplifier, LNA) and passed on (e.g., in a cable-bound manner) to the receiving electronics. In order to further improve the signal-to-noise ratio (e.g., in high-resolution images), high-field systems that may have a basic field strength of 1.5 Tesla to 12 Tesla and more are used.

The main advantage of the local coils is that the very small coil elements close to the object allow a very high signal-to-noise ratio. For this reason and on account of the possibility of accelerated measurement by k-space undersampling (e.g., parallel imaging), there is a great deal of interest in very tight arrays of coil elements and therefore local coils with a high number of read-out channels.

In these arrays of coil elements (e.g., antenna arrays), the coil elements are intended to be decoupled from one another as effectively as possible. The prior art discloses different possible ways of achieving decoupling (e.g., inductive decoupling using a carrier, capacitive decoupling using a common coil conductor, and geometric inductive decoupling, since there is an overlap between adjacent coil elements). Intersection regions that contain geometrically decoupled coil elements are produced in each local coil. The conductor tracks (e.g., coil conductors) of the coil elements intersect in the intersection regions. Parasitic capacitances may be produced, and therefore, dielectric losses may occur.

In the case of extremely tightly packed arrays of coil elements (e.g., in local head coils with 32 or more channels and therefore coil elements; in shoulder coils starting from 10 channels), the coil elements are very small, and loss mechanisms in the intersection regions gain increasing influence with respect to image quality. This analogously applies to other arrays of coil elements, in which the individual coil elements are to be very small for other reasons (e.g., in the case of magnetic resonance coils for taking images of animals and in chemical applications).

The mentioned loss mechanisms in the intersection regions are, firstly, resistive losses due to eddy currents that are generated by the conductor of a coil element in the conductor of the other coil element. Secondly, the loss mechanisms in the intersection regions are also dielectric losses due to the parasitic capacitance that is produced in the intersection region. When cost-effective dielectrics are used (e.g., as supports for the coil conductors), the losses at these points may be particularly noticeable, since these materials may also have a high loss factor ($\tan \delta$).

In addition to the losses due to dielectric and resistive losses, the coupling of the coil elements at the intersection points may also produce undesired modes (e.g., common modes) that may propagate over the entire array of coil elements. In the case of reception, this may lead to signal losses, and in the case of transmission, this may lead to undesired resonance of the local coil and as a result, to distortion of the $B_1$ homogeneity (e.g., the homogeneity of the high-frequency transmission field).

In order to solve this problem, the coil conductors may be tapered at the intersection points, and the coil conductors may be configured to be narrower, so that the parasitic capacitance falls. However, this may be counter-productive in coil elements, since wider coil conductors lead, overall, to relatively low losses.

It has also been proposed to provide manually soldered bridges in the intersection regions, so that there is a greater distance between the coil conductors of the various coil elements and, as a dielectric, there is also air between the coil conductors. Air has very good loss properties (e.g., with respect to the loss factor). However, this is disadvantageous because the manual work is costly and time-consuming and creates results that are difficult to reproduce.

SUMMARY AND DESCRIPTION

The present embodiments may obviate one or more of the drawbacks or limitations in the related art. For example, a local coil that may be produced without time-consuming and costly manual intervention and has improved loss properties in intersection regions is provided.

In one embodiment of a magnetic resonance coil, a support is formed from at least three layers of a support material. A cavity that is filled with air or a filler material, the dielectric constant of the filler material being lower than the dielectric constant of the support material, is provided in intersection regions in a middle layer.

In one embodiment, the support is constructed from a plurality of layers, so that a multilayer substrate is produced. This allows cavities to be provided in the intermediate layers within the support at the intersection points (e.g., cavities that fill at least the intersection regions). The cavities are filled with air or a dielectric. The dielectric constant of air and of the dielectric filler material is lower than the dielectric constant of the support material. It is advantageous when the loss factor of the filler material is also lower than the loss factor of the support material.

The cavity may be filled with the filler material, so that, during production, there are no problems with cavities that are included in the substrate and are filled only with air (e.g., no warpage during bending and no buckling in the event of an increase in temperature that may occur during soldering). This provides a flat, lateral structured support that changes electrical properties laterally and perpendicular to the layer.

In this way, the parasitic capacitances and the resulting loss mechanisms in arrays of coil elements for the magnetic resonance (e.g., in local coil arrays) may be considerably reduced. In this case, an extremely cost-effective construction technique is provided, since an embodiment of a dielectric that is easy to process may also be used as the support material, and a filler material with suitable dielectric properties is provided only in small regions (e.g., the intersection regions). This results in only a very slight increase in costs (e.g., in comparison to the design of the entire support from the filler material that has positive properties). A production method is provided that is not complex and may be automated. One embodiment also allows relatively low-loss dielectrics to be used in a cost-effective manner.

In one embodiment, the dielectric constant of the filler material may be less than 2 and/or the loss factor of the filler material may be less than 0.01 ($10^{-2}$). A considerable improvement in relation to the reduction of the capacitance and the eddy current losses and the dielectric losses may be provided at values below these limits.

The support material used may be an FR4 material. FR4 material is a standard printed circuit board material that may be obtained at low cost in large quantities and also in different thicknesses over large areas. In addition, the FR4 material may be processed simply in a known manner. Therefore, the FR4 material is highly suitable for the layers of the support. The filler material used may be a foam material (e.g., polyethylene foam) and/or a material including polytetrafluoroethylene. The present embodiment therefore also allows, with particular advantage, expensive, low-loss dielectrics to be used, since only a very small quantity of the dielectrics are used, and the other regions are formed from cost-effective support material (e.g., FR4 material).

The layers may have a thickness of, for example, from 0.05 to 1 mm (e.g., from 0.1 to 0.3 mm). The specific selection of the layer thickness is given by the intended application (e.g., the desired flexibility), this being a design criterion specifically in the case of local coils. If, for example, three layers with a thickness of 0.1 mm are used, this may create a flexible local coil.

In one embodiment, the at least three layers may have the same layer thickness. This refinement is relatively simple in terms of production, since only layers with a specific thickness are to be processed. If the layers are provided as films, one specific film thickness is to be processed before the layers are connected to one another.

In another embodiment, the layer having the cavities has a greater thickness than layers having no cavities. For example, when three layers are used, the middle layer (e.g., the second layer) may be thicker. Therefore, more material or air with dielectric properties that are more suitable at the intersection points may be used.

As many layers as desired may be provided in succession. The add-ons become thicker and mechanically less flexible as the height increases. For example, five layers may be provided. Cavities are located in the second and the fourth layer. In one embodiment, the cavities are provided in all the middle layers (e.g., also in the third layer), so that a greater proportion of the cavity is filled (e.g., with filler material with the layer thicknesses remaining the same).

In one embodiment, a magnetic resonance device having one embodiment of a magnetic resonance coil is provided. All embodiments relating to the magnetic resonance coil may be analogously transferred to the magnetic resonance device, so that the abovementioned advantages may also be achieved in the case of the magnetic resonance device.

In one embodiment, a method for producing a support of a magnetic resonance coil is provided. The method is distinguished in that the cavities in the middle layer are created using an etching method before connection of the layers. An etching method is suitable in order to provide the cavities in the layers so as to cover the intersection regions as far as possible. Work is carried out with a mask that is placed over the middle layer, which is to be processed. A method of this kind may be automated by, for example, the middle layer, which is intended to have the cavities, automatically acquiring the cavities in the etching method and automatically being combined with the other layers. The layers may be, for example, films including FR4 material that is easy to process. The embodiments relating to the magnetic resonance coil may also be analogously transferred to the method.

In order to connect the layers, the layers may be connected by lamination. This method is suitable when using FR4 material. Other connection variants may also be used. With respect to the coil conductors, the coil conductors may be vapor-deposited or laminated.

In one embodiment, after the cavities are etched, the middle layer may be connected to a further layer without cavities (e.g., by lamination), after which the cavities are filled with the filler material. In this way, the cavities are closed on three sides, and therefore automatically filling with the filler material may be realized in a simple manner. If a plurality of layers is provided with cavities, this method may also be repeated. In one embodiment, three layers may be an optimum number of layers.

The support may be configured with a layered structure. Other variants for reducing the losses at the intersection points may also be used. The other variants may operate with a single-layer support but may less advantageous.

In a magnetic resonance coil, the support may have a raised portion (e.g., a bridge) that is integrally formed from the support in the intersection region. If, for example, an injection-molded support that is already stable in principle is provided, a bridge may be formed from the support in the intersection regions. Even if this creates an air region between the coil conductors that may optionally be filled with a filler material, the result is still a relatively complex production method for the support. The support has raised portions that are unfavorable with respect to the space requirement, and a procedure of this kind is relatively complex in the case of thin, flexible supports, since the raised portion or bridge has a certain degree of stability.

In one embodiment of a magnetic resonance coil, spacers that correspond in size to the intersection region and/or a somewhat larger region may be fitted to the support in the intersection regions. In this case, the spacers may include a low-loss dielectric (e.g., a polyethylene foam or a material containing polytetrafluoroethylene). Only very small areas of the expensive material are used in this case too, but a deviation is also to be made from the totally flat design of the support with the coil conductors. This reduces the handleability of the coil and produces a more sensitive, projecting section in the region of the spacers. In this case, the spacer may also cover the entire surface of the support and may be considerably thinner outside the intersection regions, but with a larger quantity of material for the spacer then being required. Spacers may be laminated onto the support.

DETAILED DESCRIPTION OF THE DRAWINGS

Figure 1:
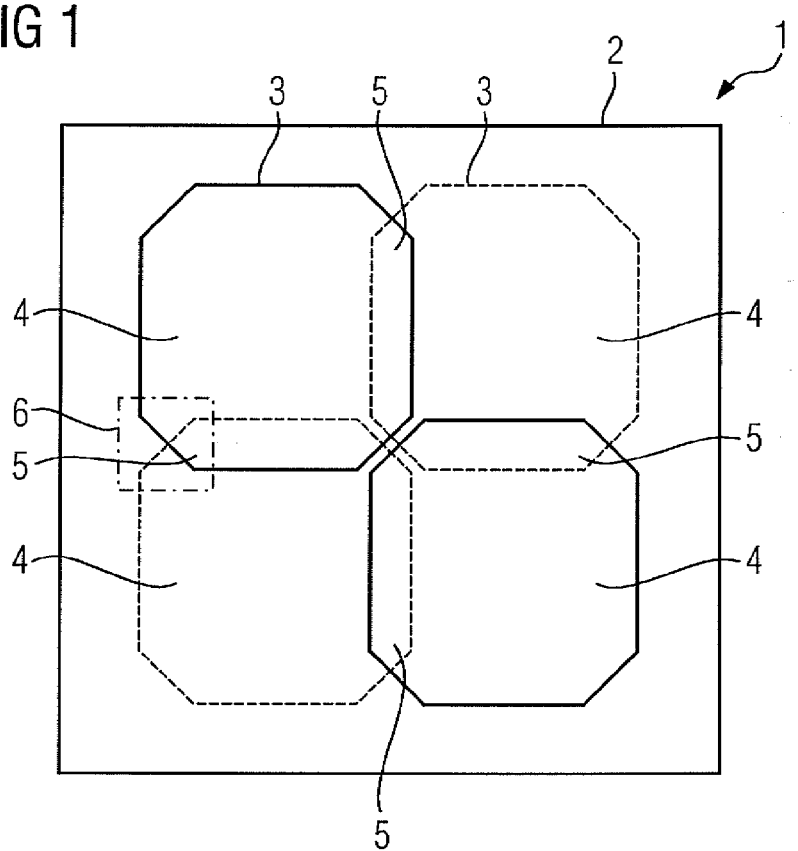
FIG. 1 shows a plan view of a coil conductor profile of one embodiment of a magnetic resonance coil.

FIG. 1 shows, in the form of a basic diagram, components of a magnetic resonance coil 1 (e.g., a local coil). The magnetic resonance coil 1 includes a flexible support 2, on both sides of which coil conductors 3 of various coil elements 4 are fitted. The coil conductors 3 that are fitted on a rear face are shown in dashed lines.

Adjacent coils, after the adjacent coils overlap, form overlap regions 5 with one another. The overlap regions serve to geometrically decouple the individual coil elements 4.

Figure 2:
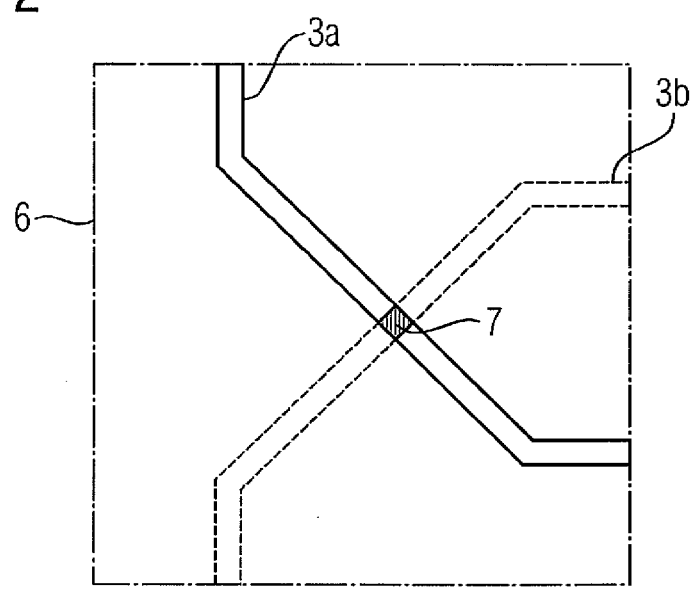
FIG. 2 shows a detail of the coil conductor profile in FIG. 1.

The coil conductors 3 of the individual coil elements 4 overlap in intersection regions, as is illustrated in greater detail by FIG. 2, which shows the detail 6 on an enlarged scale. The coil conductors 3 have a specific width, this resulting in an intersection region 7 that is hatched in FIG. 2.

These intersection regions 7 are provided when the intention is to work with very small coil elements 4, since a disruptive capacitance is established just as losses occur in the dielectric. Therefore, these points may be deactivated by a specific structure of the support 2. This is illustrated in greater detail with reference to alternative exemplary embodiments in FIGS. 3 and 4.

Figure 3:
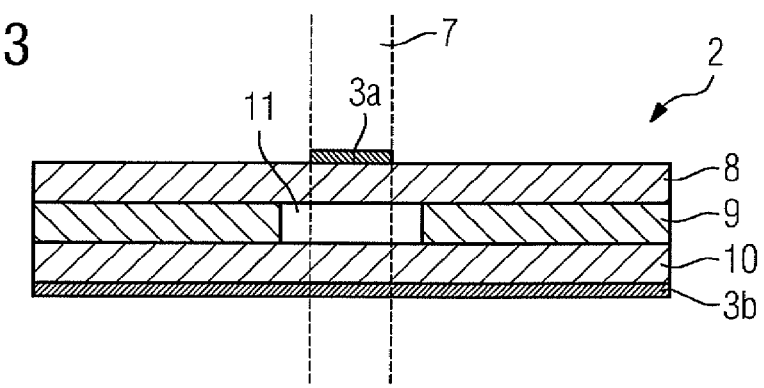
FIG. 3 shows a cross section through a support in a first exemplary embodiment of a support.

FIG. 3 shows, in cross section, a first exemplary embodiment of the design of the support 2. FIG. 3 shows a laminated or vapor-deposited coil conductor 3*a* on the upper face of the support 2, and a vapor-deposited or laminated coil conductor 3*b* that runs perpendicular to the coil conductor 3*a*, on a lower face. The intersection region 7 is also shown.

The support 2 includes, for example, three layers 8, 9 and 10. The three layers 8, 9 and 10 each have the same thickness of 0.1 mm and are composed of an FR4 material. The three layers 8, 9, 10 are therefore laminated onto one another as films.

A cavity 11 that is filled with air in this exemplary embodiment is produced by an etching method in a middle layer 9 of the at least three layers 8, 9, 10 in the intersection region 7, so as to overlap the intersection region. The cavity 11 is wider than the intersection region 7. Thus, an area in the plane of the coil elements 4 (e.g., the layer plane) is larger than an area of the intersection region 7. In this case, the area of the cavity 11 in the layer plane exceeds the area of the intersection region 7 (e.g., by 10 to 90%; in the present example by 50%).

Since air has a very low dielectric constant and very low losses (e.g., a low loss factor), the properties relating to the parasitic capacitance and the losses are reduced by the provision of the cavity 11, which is filled with air.

Figure 4:
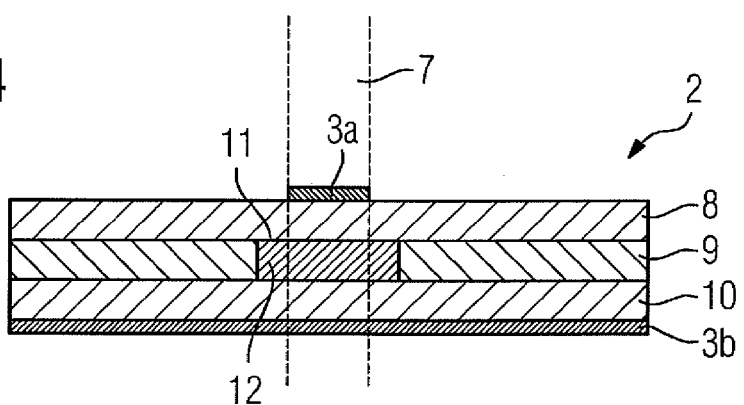
FIG. 4 shows a cross section through the support in a second exemplary embodiment of the support.

Another exemplary embodiment of the design of the support 2 is shown in FIG. 4. In order to improve the mechanical properties (e.g., the stability) of the support 2, the cavity 11 is filled with a filler material 12. In one embodiment, the filler material 12 may be a material that has a very low dielectric constant (e.g., consequently lower than the dielectric constant of the FR4 material) and a very low loss factor (e.g., consequently also lower than the loss factor of the FR4 material) and includes polytetrafluoroethylene. The dielectric constant of the filler material 12 may be less than 2, and the loss factor of the filler material 12 may be less than 0.01. The filler material 12 used may also be foam material (e.g., polyethylene foam).

The support 2 is provided with a greater degree of stability by filling the cavity 11 with the filler material 12.

The properties relating to parasitic capacitances and the loss properties are improved, without a large quantity of the filler material 12 being required.

In one embodiment, the middle layer 9 may be configured to be thicker than the two outer layers 8, 10.

In order to produce the support 2, the cavities 11 are first produced in the middle layer 9, which has not yet been connected to other layers 8, 10, by an etching method. A mask may, for example, be placed over the middle layer 9. If the cavities 11 are present first, the middle layer 9 is laminated onto one of the outer layers (e.g., layer 10). The cavities 11 are already closed on three sides. Therefore, the cavities 11 may be simply filled with the filler material 12 in an automated manner. The missing outer layer (e.g., layer 8) is laminated onto the layers 9, 10. The coil conductors 3 may be fitted, for example, by vapor-deposition or by lamination.

Figure 5:
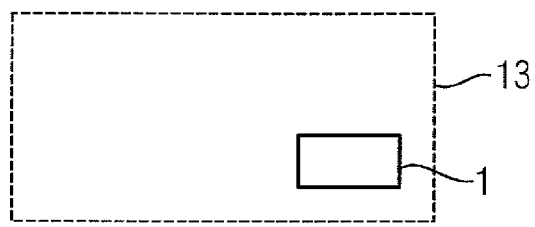
FIG. 5 shows a basic diagram of one embodiment of a magnetic resonance device.

FIG. 5 shows a basic diagram of one embodiment of a magnetic resonance device 13. Since magnetic resonance devices are largely known in the prior art, the basic components of the magnetic resonance device 13 are not explained in any detail here. The magnetic resonance device 13 includes a magnetic resonance coil 1 that is in the form of a local coil that may be placed, for example, on a patient using a flexible support 2.

Although the invention has been illustrated and described in detail by exemplary embodiments, the invention is not restricted by the disclosed examples, and other variations may be derived therefrom by a person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil for transmitting, receiving, or transmitting and receiving magnetic resonance signals, the magnetic resonance coil comprising:
   a support comprising at least three layers of support material and a cavity arranged within the support and enclosed by the at least three layers; and
   at least two overlapping coil elements, each coil element comprising a coil conductor, wherein coil conductors of the at least two overlapping coil elements intersect in intersection regions and are arranged on the support,
   wherein mutually overlapping coil elements of the at least two overlapping coil elements are arranged on different sides of the support,
   wherein the cavity is filled with air or a filler material, a dielectric constant of the filler material being lower than a dielectric constant of the support material, and
   wherein the cavity is provided in the intersection regions in a middle layer of the at least three layers.

2. The magnetic resonance coil of claim 1, wherein a loss factor of the filler material is lower than a loss factor of the support material.

3. The magnetic resonance coil of claim 1, wherein the dielectric constant of the filler material is less than 2, a loss factor of the filler material is less than 0.001, or the dielectric constant of the filler material is less than 2and the loss factor of the filler material is less than 0.001.

4. The magnetic resonance coil of claim 1, wherein the support material is a FR 4 material, and the filler material is a foam material, polytetrafluoroethylene, or a foam material and polytetrafluoroethylene.

5. The magnetic resonance coil of claim 4, wherein the foam material is a polyethylene foam.

6. The magnetic resonance coil of claim 1, wherein the at least three layers have a thickness of 0.05 to 1 mm.

7. The magnetic resonance coil of claim 6, wherein the at least three layers have a thickness of 0.1 to 0.3 mm.

8. The magnetic resonance coil of claim 1, wherein each layer of the at least three layers has a same layer thickness.

9. The magnetic resonance coil of claim 1, wherein a layer of the at least three layers having the cavity has a greater thickness than layers of the at least three layers having no cavities.

10. The magnetic resonance coil of claim 1, wherein the at least three layers comprise five layers,
    wherein cavities are located in a second layer and a fourth layer of the five layers.

11. The magnetic resonance coil of claim 1, wherein the magnetic resonance coil is a local coil.

12. A magnetic resonance device comprising:
    a magnetic resonance coil for transmitting, receiving, or transmitting and receiving magnetic resonance signals, the magnetic resonance coil comprising:
    a support comprising at least three layers of support material and a cavity arranged within the support and enclosed by the at least three layers; and
    at least two overlapping coil elements, each coil element comprising a coil conductor, wherein coil conductors of the at least two overlapping coil elements intersect in intersection regions and are arranged on the support,
    wherein mutually overlapping coil elements of the at least two overlapping coil elements are arranged on different sides of the support,
    wherein the cavity is filled with air or a filler material, a dielectric constant of the filler material being lower than a dielectric constant of the support material, and
    wherein the cavity is provided in the intersection regions in a middle layer of the at least three layers.

* * * * *